United States Patent
Syroiezhin et al.

(10) Patent No.: US 11,916,546 B2
(45) Date of Patent: Feb. 27, 2024

(54) RF SWITCH WITH COMPENSATION AND GATE BOOTSTRAPPING

(71) Applicant: Infineon Technologies AG, Neubiberg (DE)

(72) Inventors: Semen Syroiezhin, Erlangen (DE); Ivan Jevtic, Nuremberg (DE); Valentyn Solomko, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/185,564

(22) Filed: Feb. 25, 2021

(65) Prior Publication Data

US 2022/0271746 A1 Aug. 25, 2022

(51) Int. Cl.
H03K 17/74 (2006.01)
H03K 17/14 (2006.01)
H03K 17/16 (2006.01)
H03K 17/041 (2006.01)
H04B 1/44 (2006.01)

(52) U.S. Cl.
CPC ....... H03K 17/16 (2013.01); H03K 17/04106 (2013.01); H03K 17/74 (2013.01); H03K 17/145 (2013.01); H03K 2217/0054 (2013.01); H03K 2217/0081 (2013.01); H04B 1/44 (2013.01)

(58) Field of Classification Search
CPC .. H03K 17/04; H03K 17/04106; H03K 17/74; H03K 17/16; H03K 17/161; H03K 17/14; H03K 17/145; H03K 17/302; G05F 1/10
See application file for complete search history.

(56) References Cited

U.S. PATENT DOCUMENTS

| | | | |
|---|---|---|---|
| 8,368,451 B2* | 2/2013 | Mulawski | H03K 17/6871 327/308 |
| 9,595,959 B2* | 3/2017 | Keane | H03K 17/693 |
| 10,333,510 B2 | 6/2019 | Solomko et al. | |
| 10,680,599 B1 | 6/2020 | Syroiezhin et al. | |
| 2011/0148502 A1 | 6/2011 | Granger-Jones et al. | |
| 2011/0241755 A1 | 10/2011 | Mulawski et al. | |
| 2014/0002171 A1 | 1/2014 | Nohra | |
| 2020/0321957 A1 | 10/2020 | Syroiezhin et al. | |
| 2020/0382114 A1* | 12/2020 | Scott | H03K 17/74 |

* cited by examiner

Primary Examiner — Patrick C Chen
(74) Attorney, Agent, or Firm — Slater Matsil, LLP

(57) ABSTRACT

A radio frequency switch device includes a first transistor and a second transistor; a compensation network coupled between a body terminal of the first transistor and a source/drain terminal of the second transistor; and a bootstrapping network having a first terminal coupled to a first bias terminal, a second terminal coupled to a gate terminal of the first transistor, and a third terminal coupled to the body terminal of the first transistor, wherein the bootstrapping network establishes a low impedance path between the gate terminal and the body terminal of the first transistor in response to a first voltage value of the first bias terminal, and wherein the bootstrapping network establishes a high impedance path between the gate terminal and the body terminal of the first transistor in response to a second voltage value of the first bias terminal.

12 Claims, 12 Drawing Sheets no RF applied
(nominal DC
operating point)

large RF signal
no GIDL compensation
no local gate bootstraping large RF signal
with GIDL compensation
no local gate bootstraping large RF signal
with GIDL compensation
with local gate bootstraping

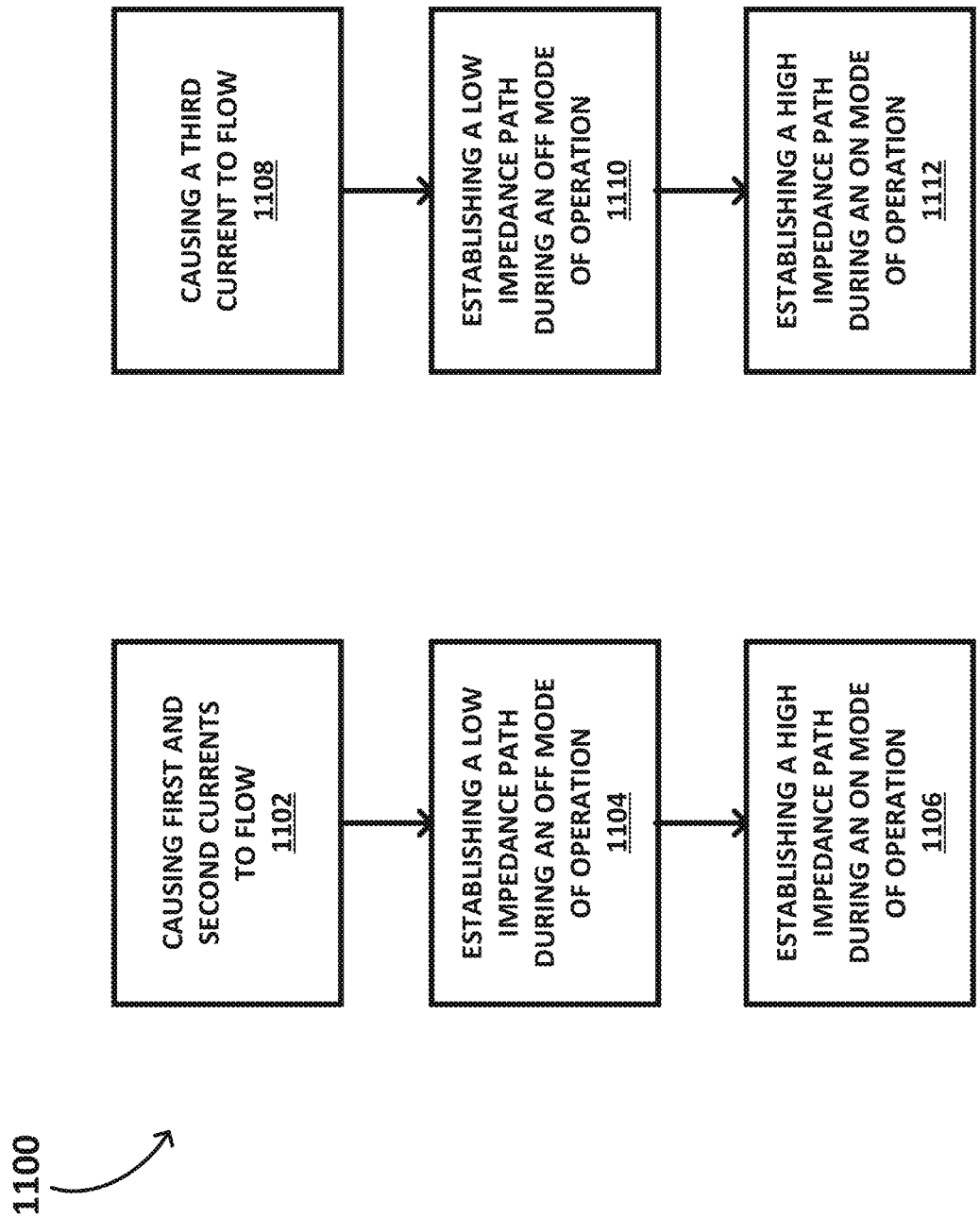

RF SWITCH WITH COMPENSATION AND GATE BOOTSTRAPPING

TECHNICAL FIELD

The present invention relates generally to a radio-frequency switch with leakage compensation and gate bootstrapping, and an associated method.

BACKGROUND

High voltage (HV) radio-frequency (RF) switches are known in the art and are typically implemented as stacked MOSFET devices on a silicon substrate. HV RF switches can be used as antenna tuning switchable elements, such as HV antenna tuning switches and tunable passive components. HV RF switches can be used in cellular handheld devices to tune the impedance and radiation properties of compact antennas. The HV RF switches are attached between the feed or aperture points of an antenna and ground plane via external surface-mount device (SMD) capacitors or inductors. Another application of the HV RF switches is as antenna switches for cellular base stations, where the switches may be stressed with RF voltages exceeding 100 V.

A typical challenge in antenna tuning switch design is to achieve high voltage handling at RF frequencies, reaching values of 80 V peak (for cellular user equipment) and above 100 V (for cellular base station equipment), while otherwise sustaining the same performance as at low RF voltages.

SUMMARY

According to an embodiment, a radio frequency (RF) switch device includes a first transistor and a second transistor, wherein the first and second transistors are coupled in series at a first source/drain terminal of the second transistor to establish a switchable RF path; a first compensation network coupled between a body terminal of the first transistor and a second source/drain terminal of the second transistor, wherein the first compensation network is configured to establish a path for current flowing between the body terminal of the first transistor and the second source/drain terminal of the second transistor in a first direction and to block current flowing therebetween in a second direction opposite to the first direction; and a first bootstrapping network having a first terminal coupled to a first bias terminal, a second terminal coupled to a gate terminal of the first transistor, and a third terminal coupled to the body terminal of the first transistor, wherein the first bootstrapping network is configured to establish a low impedance path between the gate terminal and the body terminal of the first transistor in response to a first voltage value of the first bias terminal, and wherein the first bootstrapping network is configured to establish a high impedance path between the gate terminal and the body terminal of the first transistor in response to a second voltage value of the first bias terminal.

According to an embodiment, a radio frequency (RF) switch device includes a first transistor and a second transistor, wherein the first and second transistors are coupled in series at a first source/drain terminal of the second transistor to establish a switchable RF path; a first compensation network coupled between a body terminal of the first transistor and a second source/drain terminal of the second transistor, wherein the first compensation network is configured to establish a path for current flowing between the body terminal of the first transistor and the second source/drain terminal of the second transistor in a first direction and to block current flowing therebetween in a second direction opposite to the first direction; and a first bootstrapping network having a first terminal coupled to a first bias terminal, a second terminal coupled to a gate terminal of the first transistor, and a third terminal coupled to an internal node of the first compensation network, wherein the first bootstrapping network is configured to establish a low impedance path between the gate terminal and the body terminal of the first transistor in response to a first voltage value of the first bias terminal, and wherein the first bootstrapping network is configured to establish a high impedance path between the gate terminal and the body terminal of the first transistor in response to a second voltage value of the first bias terminal.

According to embodiment, a method of compensating a radio frequency (RF) switch device including a first transistor and a second transistor forming a switchable current path, the method including causing a first current to flow between a body terminal of the first transistor and a drain terminal of the second transistor in a first direction and causing a second current to flow therebetween in a second direction opposite to the first direction, wherein the first current is larger than the second current; establishing a low impedance path between a gate terminal and the body terminal of the first transistor during an OFF mode of operation of the RF switch device; and establishing a high impedance path between the gate terminal and the body terminal of the first transistor during an ON mode of operation of the RF switch device.

BRIEF DESCRIPTION OF THE DRAWINGS

For a more complete understanding of the present invention, and the advantages thereof, reference is now made to the following descriptions taken in conjunction with the accompanying drawings, in which:

FIG. 11 is a block diagram of a bootstrapping method for an RF switch according to an embodiment.

DETAILED DESCRIPTION OF ILLUSTRATIVE EMBODIMENTS

Figure 1:
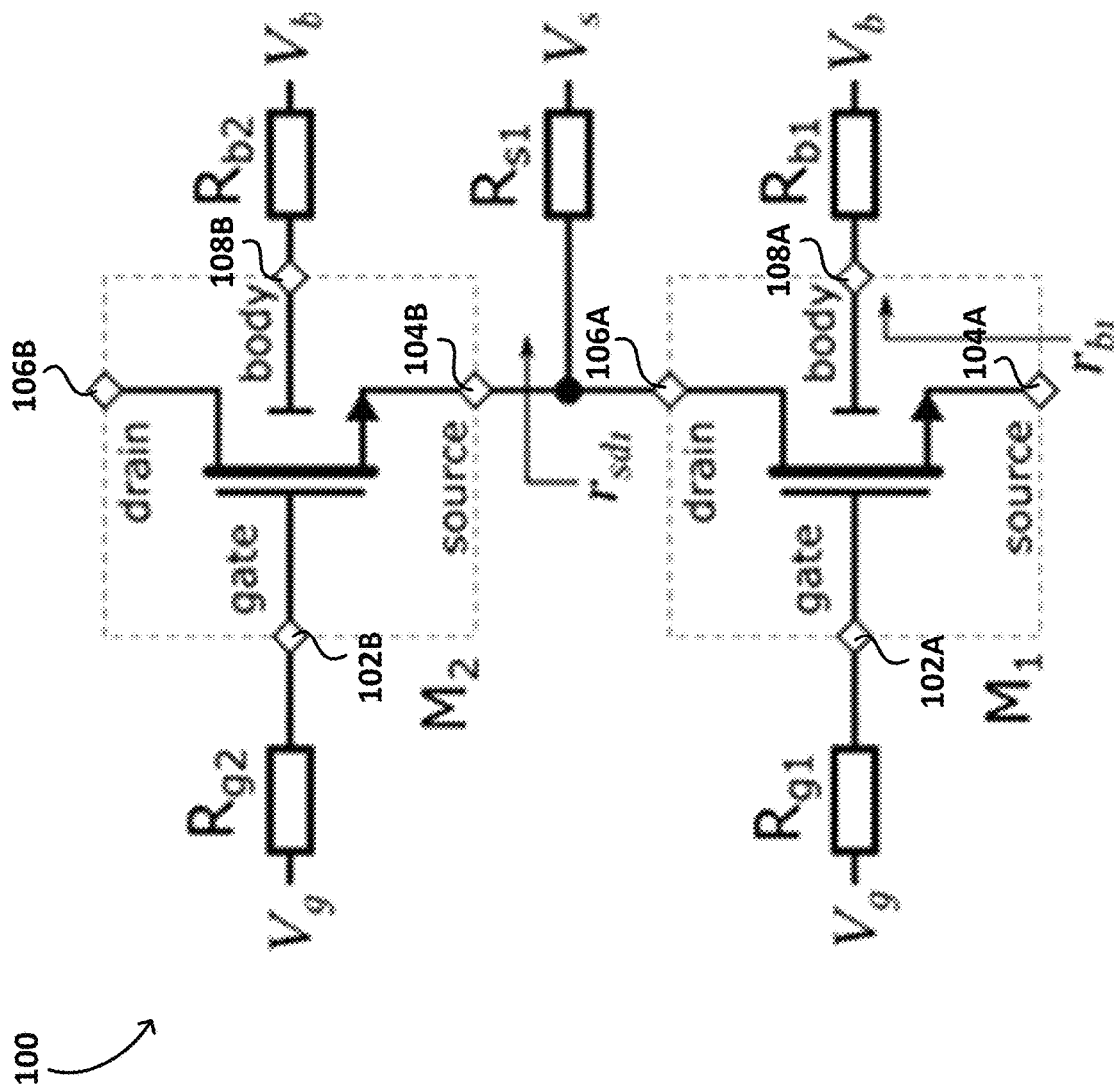
FIG. 1 is a schematic diagram of an exemplary RF switch having a first bias network.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The high voltage handling of HV RF switches at RF frequencies can be improved through the use of compensation circuits for compensating leakage currents present during an OFF mode of operation, which may compromise high voltage handling performance. HV RF switch compensation circuits are described in U.S. Pat. Nos. 10,333,510, 10,680,599, and US Patent Application No. 2020/0321957, each of which is hereby incorporated in their entirety. In addition to the action of the compensation circuits, the high voltage handling of the HV RF switches can be further improved through the action of a bootstrapping circuit, which is described in further detail below according to embodiments. The bootstrapping circuit improves high voltage handling performance by establishing a low impedance path between a gate terminal and the body terminal of at least one transistor in the RF switch during an OFF mode of operation of the RF switch, and establishing a high impedance path between the gate terminal and the body terminal of the at least one transistor during an ON mode of operation of the RF switch device. The low impedance path between the gate terminal and the body terminal advantageously improves biasing conditions of the RF switch in order to withstand even higher voltages during the OFF mode of operation, and the corresponding high impedance path between the gate terminal and the body terminal does not adversely affect switch performance during the ON mode operation of the RF switch.

An RF switch arrangement typically comprises a stacked arrangement of a plurality of MOS transistors since the extremely high voltage requirements of the RF switch arrangement far exceed the voltage handling capability of any individual MOS transistor in the stack. The total number of transistors in the stack is determined by the maximum voltage handling capability desired divided by the maximum voltage handling capability of an individual MOS transistor. Typically, ten or more MOS transistors are used in embodiments, but the exact number of transistors used can vary in different applications.

An individual MOS transistor used in RF switch arrangements comprises a gate terminal, a source terminal, a drain terminal and a body terminal. For proper operation, the MOS transistor is biased to the desired operating point by means of high-ohmic linear resistors. High-resistive DC path is provided for all terminals, including gate, source, drain and body terminals. After applying target DC voltages at each terminal via high-ohmic bias resistors the gate-source, gate-drain, drain-body and source-body voltages define the operating point of the MOS transistor in the switch arrangement, with the gate-source voltage and the gate-drain voltage being particularly important in defining the desired operating point of the MOS transistor.

Figure 2:
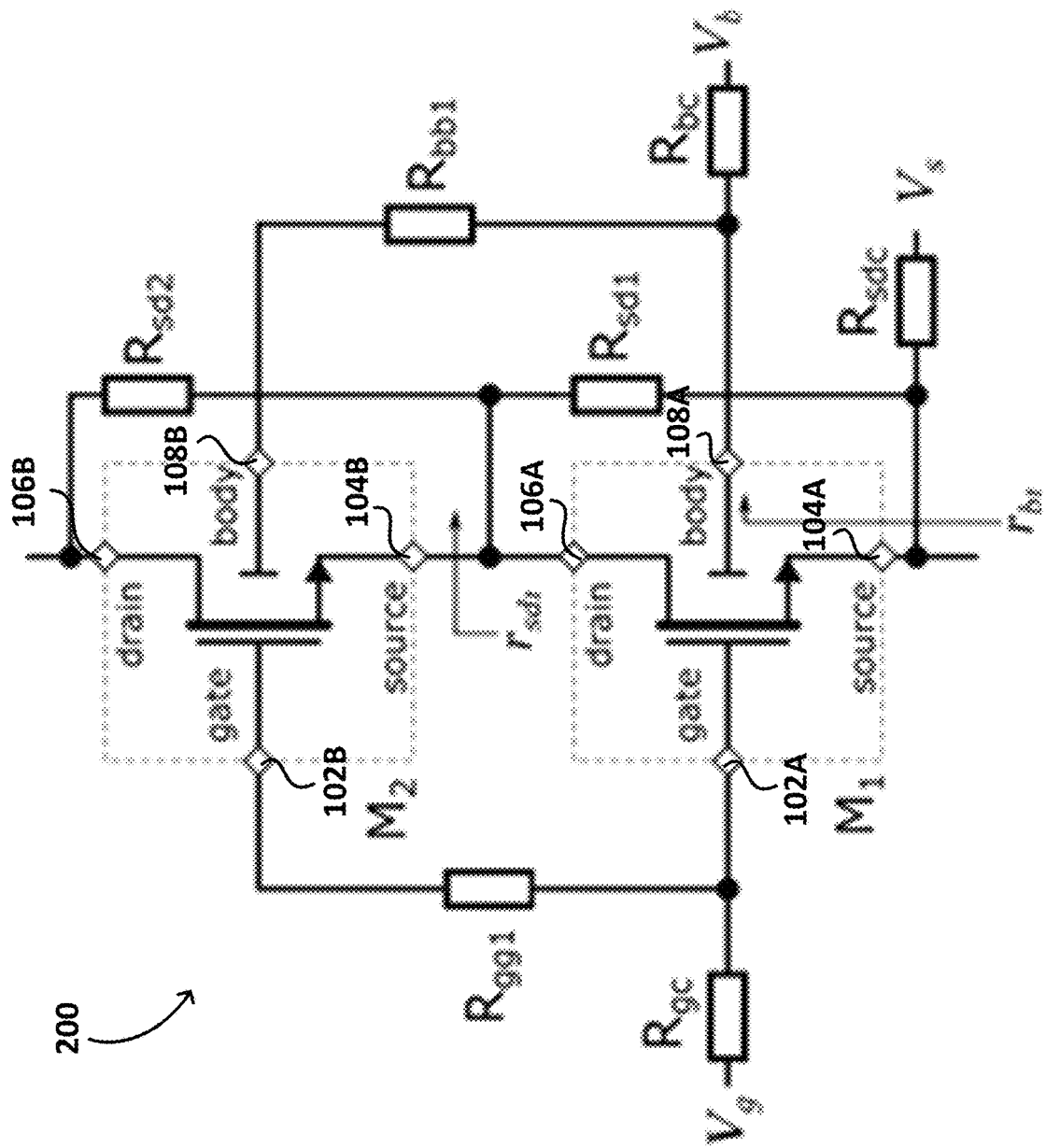
FIG. 2 is a schematic diagram of an exemplary RF switch having a second bias network.

An example of an RF switch arrangement with two MOS transistors and the bias network thereof is shown in FIG. 1 and FIG. 2. For simplicity only two MOS transistors out of the full plurality of MOS transistors are shown. Various other possible arrangements of the bias networks shown in FIG. 1 and FIG. 2 are known in the art.

In FIG. 1, exemplary RF switch arrangement 100 includes a first MOS transistor $M_1$ having a gate terminal 102A, a source terminal 104A, a drain terminal 106A, and a body terminal 108A, and a second MOS transistor $M_2$ having a gate terminal 102B, a source terminal 104B, a drain terminal 106B, and a body terminal 108B. The source terminal 104B of transistor $M_2$ is coupled to the drain terminal 106A of transistor $M_1$ in exemplary RF switch arrangement 100. High-ohmic resistors are coupled between the gate, source-drain and body terminals of respective transistors in the stack and the corresponding bias DC voltages $V_g$, $V_b$, and $V_s$, as shown in FIG. 1. For example, for transistor $M_1$, high-ohmic resistor $R_{g1}$ is coupled between DC bias voltage $V_g$ and gate terminal 102A and high-ohmic resistor $R_{b1}$ is coupled between DC bias voltage $V_b$ and body terminal 108A. For transistor $M_2$, high-ohmic resistor $R_{g2}$ is coupled between DC bias voltage $V_g$ and gate terminal 102B and high-ohmic resistor $R_{b2}$ is coupled between DC bias voltage $V_b$ and body terminal 108B. Finally, a high-ohmic resistor $R_{s1}$ is coupled to the drain terminal 106A of transistor $M_1$ and the source terminal 104B of transistor $M_2$.

In FIG. 2, exemplary RF switch arrangement 200 also includes a first MOS transistor $M_1$ having a gate terminal 102A, a source terminal 104A, a drain terminal 106A, and a body terminal 108A, and a second MOS transistor $M_2$ having a gate terminal 102B, a source terminal 104B, a drain terminal 106B, and a body terminal 108B. The source terminal 104B of transistor $M_2$ is also coupled to the drain terminal 106A of transistor $M_1$ in exemplary RF switch arrangement 200. High-ohmic resistors are coupled between the gate, source-drain and body nodes of respective transistors in the stack, forming a series chain of bias resistors tapped to bias voltages at one or multiple points along the chain, as shown in FIG. 2. For example, high-ohmic resistor $R_{gg1}$ is coupled between the gate terminal 102A of transistor $M_1$ and the gate terminal 102B of transistor $M_2$, and high-ohmic resistor $R_{gc}$ is coupled between DC bias voltage $V_g$ and the gate terminal 102A of transistor $M_1$. High-ohmic resistor $R_{bb1}$ is coupled between the body terminal 108A of transistor $M_1$ and the body terminal 108B of transistor $M_2$, and high-ohmic resistor $R_{bc}$ is coupled between DC bias voltage $V_b$ and the body terminal 108A of transistor $M_1$. Finally, a high-ohmic resistor $R_{sd1}$ is coupled between the source terminal 104A of transistor $M_1$ and the drain terminal 106A of transistor $M_1$, a high-ohmic resistor $R_{sd2}$ is coupled between the source terminal 104B of transistor $M_2$ and the drain terminal 106B of transistor $M_2$, and a high-ohmic resistor $R_{sdc}$ is coupled between DC bias voltage $V_s$ and the source terminal 104A of transistor $M_1$.

In addition to the RF switch arrangements shown in FIG. 1 and FIG. 2, any combination thereof can also be used in a single RF switch, according to embodiments. Also, in addition to the RF switch arrangements shown in FIG. 1 and FIG. 2, any combination thereof can also be used in a single RF switch, where $V_b$ and/or $V_s$ are feedback-regulated bias voltages according to embodiments described in U.S. Pat. No. 10,333,510.

The RF switch arrangements shown in FIG. 1 and FIG. 2 provide a high impedance $r_{sd1}$ at source-drain nodes and $r_{b1}$ at body nodes, with possibly different absolute values for $r_{sd1}$ and $r_{b1}$ for each arrangement.

Figure 3:
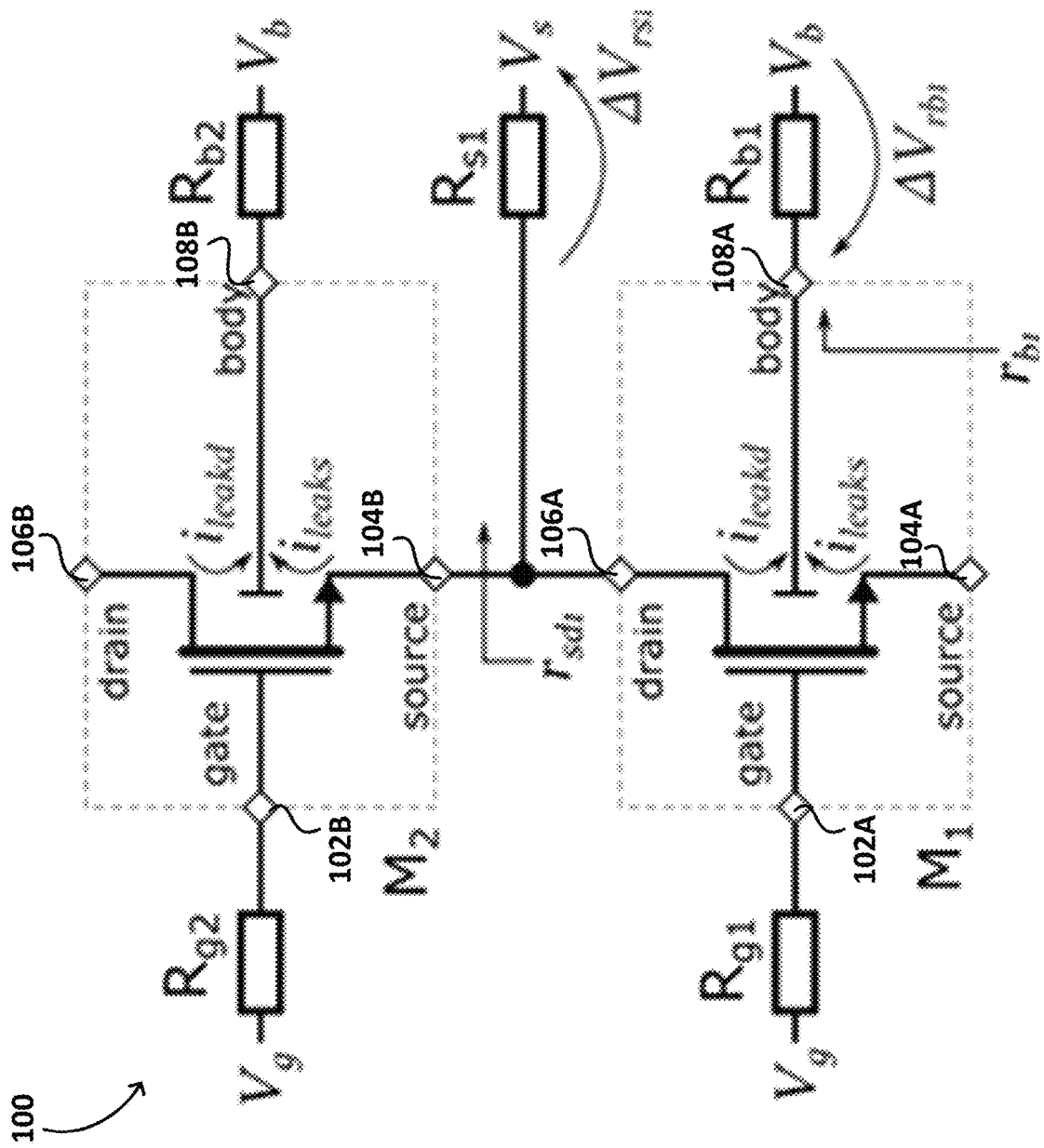
FIG. 3 is a schematic diagram of the exemplary RF switch of FIG. 1 showing leakage currents generated in response to an applied high RF voltage.

FIG. 3 is a schematic diagram of the exemplary RF switch arrangement 100 of FIG. 1 showing leakage currents generated in response to an applied high RF voltage. When the RF switch arrangement 100 of FIG. 3 is exposed to high peak voltages at RF frequencies (defined as the peak voltage at which the voltage drop across each individual transistor $M_1$ and $M_2$ in the stack of MOS transistors approaches a maximum allowable level for a given MOS transistor type), parasitic leakage currents $i_{leakd}$ and $i_{leaks}$ begin flowing from drain and source terminals into the body terminals of the respective MOS transistor in the RF switch arrangement 100. These leakage currents shift the operating point of MOS transistors $M_1$ and $M_2$ when flowing into respective high-ohmic bias resistors $R_{b1}$, $R_{b2}$, and $R_{s1}$ is shown by the following equations:

the drain voltage of MOS transistor $M_1$ and source voltage of MOS transistor $M_2$ is shifted by the value of $\Delta V_{rs1} = R_{s1}(i_{leakd} + i_{leaks})$; the body voltage of MOS transistor $M_1$ is shifted by the value of $\Delta V_{rb1} = R_{b1}(i_{leakd} + i_{leaks})$; the body voltage of MOS transistor $M_2$ is shifted by a value equal to $\Delta V_{rb1}$ if the value of resistor $R_{b1}$ is equal to the value of resistor $R_{b2}$; and the gate voltage of MOS transistors $M_1$ and $M_2$ remains unchanged as there is no current flowing through the gate oxide through high-ohmic resistors $R_{g1}$ and $R_{g2}$.

Such change in DC voltages at the terminals of the switch transistor may somewhat limit maximum voltage handling capability, primarily because the gate-source DC voltage becomes less negative along the stack of the RF switch arrangement.

Solutions for the compensation of operating point shift at high RF voltages due to leakage current are known in the art. For example, in U.S. Pat. No. 10,333,510 the RF switch arrangement comprises dynamically-adjustable bias DC voltages $V_s$ and/or $V_b$. The leakage current into the source and drain terminals of the MOS RF switch transistor is sensed, the bias voltage $V_s$ and/or $V_b$ at high-ohmic biasing resistor is adjusted to keep MOS RF switch transistor in the desired operating point. Another solution for the compensation of operating point shift at high RF voltages due to leakage current is described in U.S. Pat. No. 10,680,599. The compensation described in U.S. Pat. No. 10,680,599 is referred to herein as Gate-Induced Drain Leakage (GIDL) compensation. A nonlinear compensation circuit is added between the drain terminal of each transistor in the stack of the RF switch arrangement and the body terminal of the adjacent transistor in the stack of the RF switch arrangement as is shown in FIG. 4.

Figure 4:
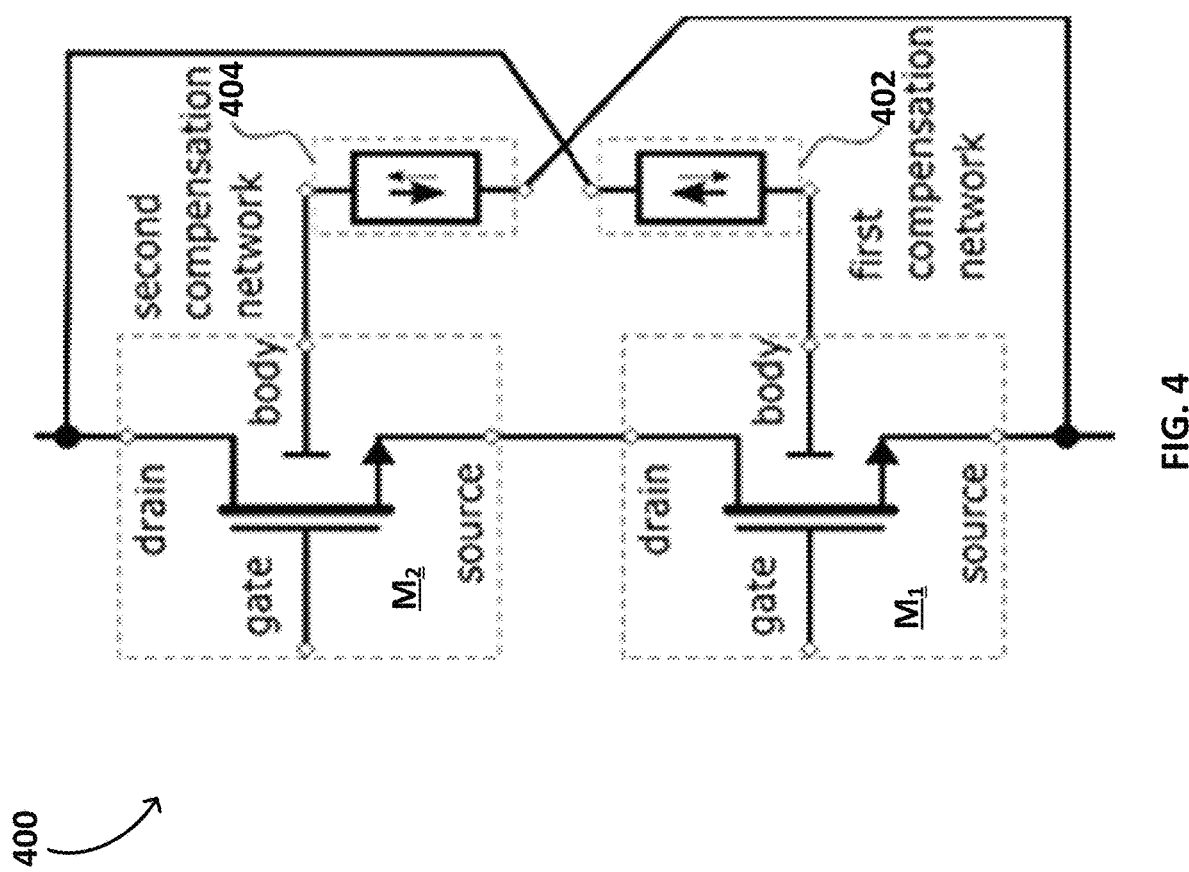
FIG. 4 is a schematic diagram of an exemplary RF switch including leakage compensation.

FIG. 4 is a schematic diagram of an exemplary RF switch 400 including GIDL leakage compensation including a stack of MOS transistors $M_1$ and $M_2$, wherein the drain of MOS transistor $M_1$ is coupled to the source of MOS transistor $M_2$. Exemplary RF switch 400 shows a first nonlinear compensation network 402 coupled between the drain terminal of MOS transistor $M_2$ and the body terminal of transistor $M_1$. Exemplary RF switch 400 also shows a second nonlinear compensation network 404 coupled between the source terminal of MOS transistor $M_1$ and the body terminal of transistor $M_2$. The nonlinearity function of the two nonlinear compensation circuits is the same between a body terminal and a source or drain terminal of the adjacent transistor in the stack as is shown in FIG. 4. Other combinations of nonlinear compensation circuits are described in U.S. Pat. No. 10,680,599.

This GIDL compensation circuits shown in FIG. 4 may stabilize the operating point of MOS transistors in an RF switch at high drive levels. However, in some applications it may also tend to over compensate the operating point of the MOS transistors, making the body voltage more negative and the drain/source voltages more positive than in the nominal operating point, where no RF signal is applied to the switch. The GIDL compensation circuit shown in FIG. 4, in combination with a proposed gate bootstrapping network may advantageously bring further benefits to the operating point distribution along the switch stack, as will be shown and described below.

Figure 5:
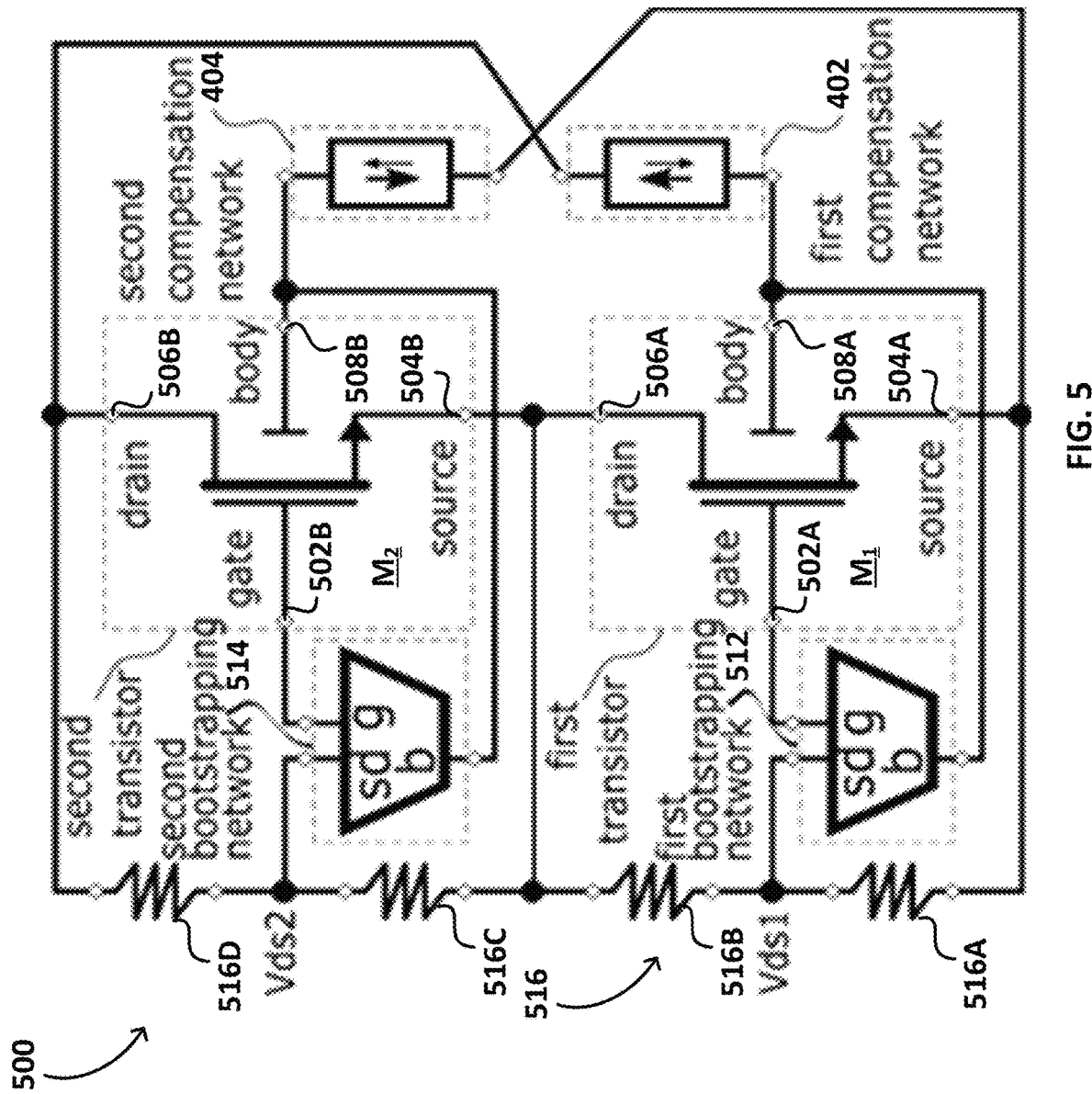
FIG. 5 is a schematic diagram of an RF switch including leakage compensation and gate bootstrapping according to an embodiment.

According to embodiments, at least one bootstrapping network is added to the stacked RF switch 400 with GIDL compensation as was shown in FIG. 4 and previously described. An RF switch 500 including stacked transistors, GIDL compensation networks, and two embodiment bootstrapping networks is shown in FIG. 5 and is described in further detail below. Practical implementation of the bootstrapping network additionally comprises high-ohmic bias resistor networks around the gate terminal, the source-drain terminals, and the body terminal of the transistors in the RF switch 500, which are not shown in FIG. 5 for simplicity.

FIG. 5 thus shows an RF switch 500 including two transistors $M_1$ and $M_2$ in a stacked configuration, although a practical implementation of RF switch 500 may include a multiplicity of such stacked MOS transistors, which are not shown in FIG. 5. MOS transistor $M_1$ includes a gate terminal 502A, a source terminal 504A, a drain terminal 506A, and a body terminal 508A, MOS transistor $M_2$ includes a gate terminal 502B, a source terminal 504B, a drain terminal 506B, and a body terminal 508B, and the drain terminal 506A of MOS transistor $M_1$ is coupled to the source terminal 504B of MOS transistor $M_2$ in the stacked configuration. RF switch 500 also includes a first nonlinear compensation network 402 coupled between body terminal 508A of MOS transistor $M_1$ and the drain terminal 506B of MOS transistor M₂, and a second nonlinear compensation network 404 coupled between body terminal 508B of MOS transistor M₂ and the source terminal 504A of MOS transistor M₁, both of which have been previously described. RF switch 500 also includes a biasing network 516 comprising resistors 516A, 516B, 516C, and 516D coupled together in series fashion. Resistors 516A and 516B are coupled between source terminal 504A of MOS transistor M₁ and the drain terminal 506A of MOS transistor M₁, having an intermediate or tap terminal designated $V_{DS1}$. Resistors 516C and 516D are coupled between source terminal 504B of MOS transistor M₂ and the drain terminal 506B of MOS transistor M₂, having an intermediate or tap terminal designated $V_{DS2}$. Finally, RF switch 500 also includes a first bootstrapping network 512 coupled between biasing network 516 and MOS transistor M₁, and a second bootstrapping network 514 coupled between biasing network 516 and MOS transistor M₂, according to an embodiment. The implementation and function of the first bootstrapping network 512 and the second bootstrapping network 514, and the connections to RF switch 500 are described in further detail below.

The circuit that performs the bootstrapping of the gate terminal of an MOS transistor during high voltage operation in the OFF state of RF switch 500 is described herein as a "bootstrapping network" or "gate bootstrapping network". The circuit of bootstrapping networks 512 and 514 comprises three terminals, "b" for "body terminal, "g" for "gate terminal", and "sd" for "source/drain" terminal as is shown in FIG. 5. In an embodiment the "b" terminal is coupled to the body of a respective switch transistor, directly or via a resistive element, for example a resistor. In an embodiment the "g" terminal is coupled to the gate terminal of a respective switch transistor, directly or via a resistive element. In an embodiment the "sd" terminal is coupled to a tap terminal of a biasing network with a DC voltage ranging between the source and drain voltages of a respective switch transistor. In other words, the "sd" terminal of the bootstrapping network can be coupled to the source terminal and the drain terminal of a respective switch transistor via the tap terminal of a resistive divider coupled between these terminals.

The function of the bootstrapping network can therefore be described according to the following equation, wherein $V_g$ is the gate terminal voltage of a respective RF switch transistor, $V_b$ is the body terminal voltage of the respect RF switch transistor, and $V_{sd}$ is the voltage between the source and drain of the respective RF switch transistor:

$$\begin{cases} \text{low impedance between } Vg \text{ and } Vb, \text{ if } Vg < Vsd \\ \text{high impedance between } Vg \text{ and } Vb, \text{ if } Vg \geq Vsd \end{cases}.$$

Alternatively, the function of the bootstrapping network may also be described as follows:

$$\begin{cases} \text{low impedance between } Vg \text{ and } Vb, \text{ if } Vg < Vsd \\ \text{high impedance between } Vsd \text{ and } Vb, \text{ if } Vg \geq Vsd \end{cases}.$$

Alternatively, the function of the bootstrapping network may also be described as follows:

$$V_b \approx \min\{V_g, V_{sd}\}.$$

Figure 7:
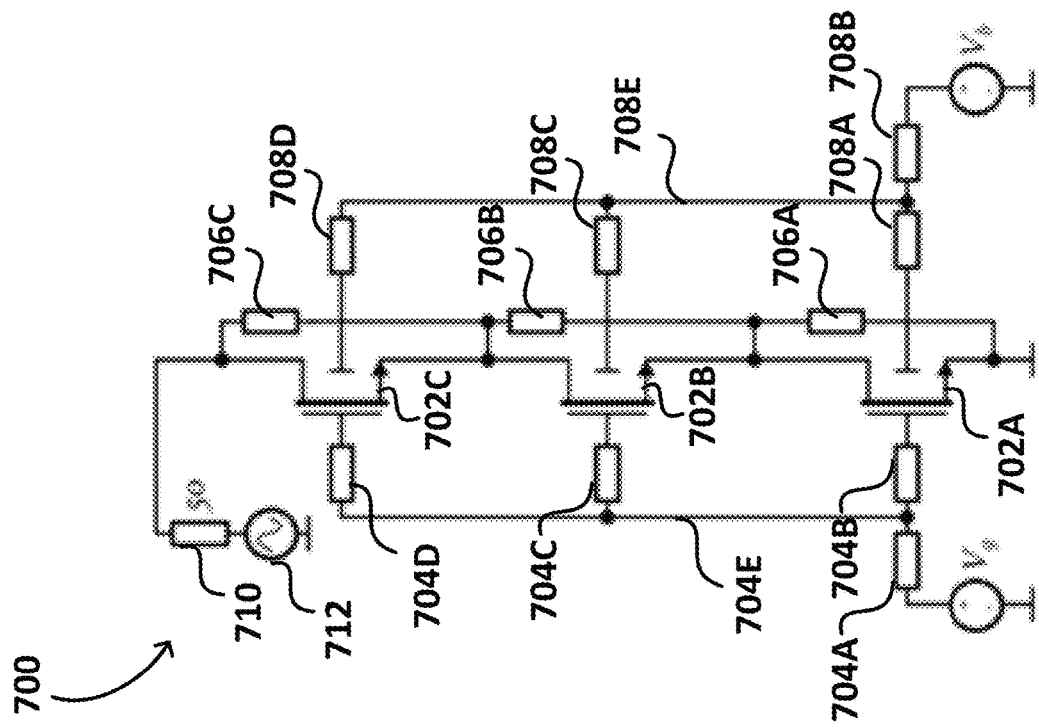
FIG. 7 is a schematic diagram of a stacked RF switch having a second bias network.
Figure 6:
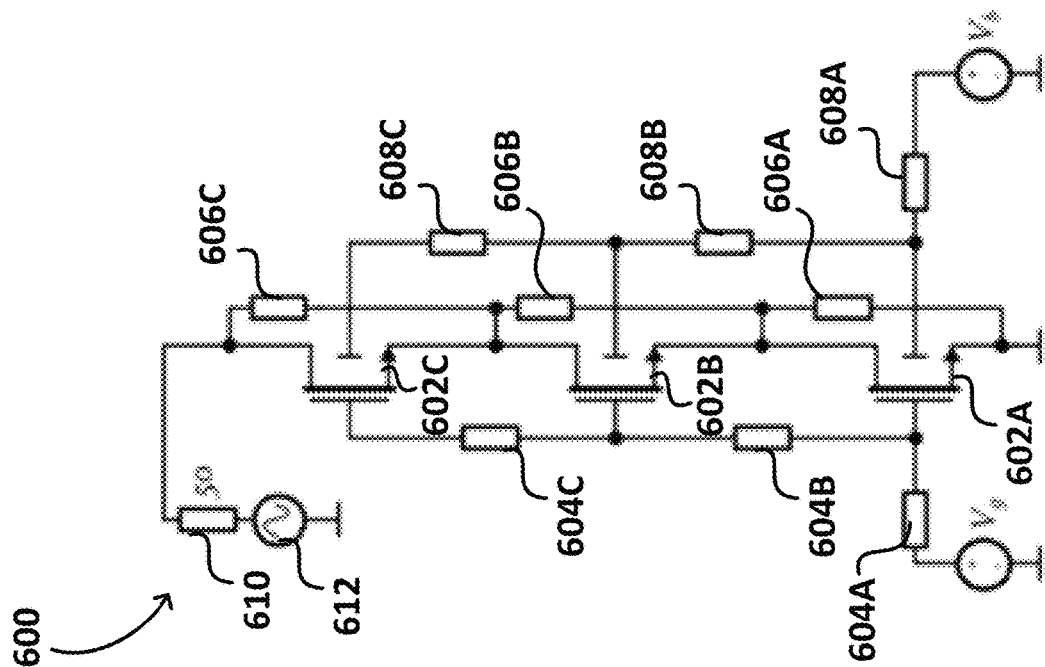
FIG. 6 is a schematic diagram of a stacked RF switch having a first bias network.

The beneficial effect of gate bootstrapping in a leakage-compensated switch according to embodiments is graphically illustrated in FIGS. 8A, 8B, 8C, 8D, 8E, 8F, 8G, and 8H for two different RF switch bias configurations. The graphs of FIGS. 8A, 8B, 8C, and 8D are associated with the stacked RF switch having a first bias network as is shown in FIG. 6. The graphs of FIGS. 8E, 8F, 8G, and 8H are associated with the stacked RF switch having a second bias network as is shown in FIG. 7. The stacked RF switches and graphically illustrated biasing conditions of the stacked RF switches are described in further detail below.

FIG. 6 is a schematic diagram of a stacked RF switch 600 having a first bias network. RF switch 600 comprises MOS transistors 602A, 602B, and 602C is a stacked configuration. RF switch 600 also comprises an RF signal source 612 coupled to the drain of MOS transistor 602C through a low value resistor 610. In an embodiment resistor 610 has a value of 50 ohms. RF switch 600 also comprises a gate terminal bias voltage source $V_g$, and a body terminal voltage source $V_b$. A first gate bias resistor 604A is coupled between the gate terminal bias voltage source $V_g$ and the gate terminal of MOS transistor 602A, a second gate bias resistor 604B is coupled between the gate terminal of MOS transistor 602A and the gate terminal of MOS transistor 602B, and a third gate bias resistor 604C is coupled between the gate terminal of MOS transistor 602B and the gate terminal of MOS transistor 602C. A first source/drain bias resistor 606A is coupled between the source and drain terminals of MOS transistor 602A, a second source/drain bias resistor 606B is coupled between the source and drain terminals of MOS transistor 602B, and a third source/drain bias resistor 606C is coupled between the source and drain terminals of MOS transistor 602C. A first body bias resistor 608A is coupled between the body terminal bias voltage source $V_b$ and the body terminal of MOS transistor 602A, a second body bias resistor 608B is coupled between the body terminal of MOS transistor 602A and the body terminal of MOS transistor 602B, and a third body bias resistor 608C is coupled between the body terminal of MOS transistor 602B and the body terminal of MOS transistor 602C. All of the bias resistors shown in FIG. 6, except for resistor 610, can comprise high-ohmic bias resistors in an embodiment.

FIG. 7 is a schematic diagram of a stacked RF switch having a second bias network. RF switch 700 comprises MOS transistors 702A, 702B, and 702C is a stacked configuration. RF switch 700 also comprises an RF signal source 712 coupled to the drain of MOS transistor 702C through a low value resistor 710. In an embodiment resistor 710 has a value of 50 ohms. RF switch 700 also comprises a gate terminal bias voltage source $V_g$, and a body terminal voltage source $V_b$. A first gate bias resistor 704A and a second gate bias resistor 704B are coupled between the gate terminal bias voltage source $V_g$ and the gate terminal of MOS transistor 702A, a third gate bias resistor 704C is coupled between internal node 704E and the gate terminal of MOS transistor 702B, and a fourth gate bias resistor 704D is coupled between internal node 704E and the gate terminal of MOS transistor 702C. A first source/drain bias resistor 706A is coupled between the source and drain terminals of MOS transistor 702A, a second source/drain bias resistor 706B is coupled between the source and drain terminals of MOS transistor 702B, and a third source/drain bias resistor 706C is coupled between the source and drain terminals of MOS transistor 702C. A first body bias resistor 708A and second body bias resistor 708B are coupled between the body terminal bias voltage source $V_b$ and the body terminal of MOS transistor 702A, a third body bias resistor 708C is coupled between internal node 708E and the body terminal of MOS transistor 702B, and a fourth body bias resistor 708D is coupled between internal node 708E and the body terminal of MOS transistor 702C. All of the bias resistors shown in FIG. 7, except for resistor 710, can comprise high-ohmic bias resistors in an embodiment.

DC operating points of RF switch 600 in an OFF mode of operation are shown in the graphs of FIGS. 8A-8D and described below, and DC operating points of RF switch 700 in an OFF mode of operation are shown in the graphs of FIGS. 8E-8H, wherein the X-axis of each graph represents the rank order of a transistor in the corresponding RF switch stack, and the Y-axis of each graph represents the value of a DC voltage component of the DC operating point.

An important parameter shown in the graphs of FIGS. 8A-8D and 8E-8H for maximizing voltage handling capabilities of the RF switch is the gate-source voltage distribution of a transistor along the stack of switch transistors, which primarily defines the operating point (OP) of the individual switch transistors. Ideally, the gate-source voltage of the switch transistors should be as flat as possible and should be more negative than the nominal operating point (i.e. OP when no RF signal is applied).

As can be seen from the graphs of FIGS. 8A-8D and 8E-8H, when no gate bootstrapping is utilized, the OP shift is primarily defined by the drain/source voltage shift for a high RF drive signal. The gate voltage always remains constant due to the fact that there is no substantial current flowing into the gate. The body voltage shift does not influence the gate-source operating point.

According to embodiment concepts, gate bootstrapping takes advantage of the beneficial body voltage shift provided by the GIDL compensation circuit onto the transistors operating point. This is achieved by providing a low-impedance path between the body and gate such that the gate voltage also reduces when the switch is compensated by the GIDL compensation circuit. The gate-source operating point is the most beneficial with respect to high voltage handling capability of the RF switch when gate bootstrapping is applied to at least one of the transistors in the RF switch.

Figure 8A:
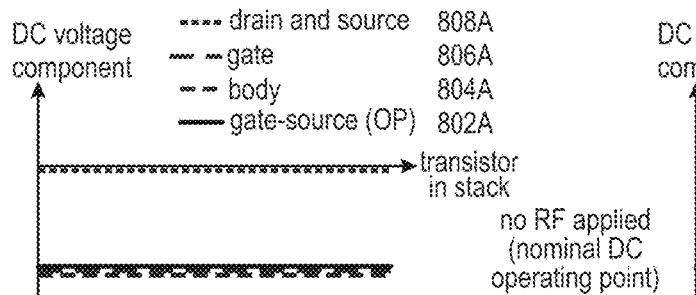
FIG. 8A is a graph of DC voltage components of the stacked RF switch of FIG. 6 for a nominal DC operating point.

FIG. 8A is a graph of DC voltage components of the stacked RF switch 600 of FIG. 6 for a nominal DC operating point, wherein no RF signal is applied to RF switch 600. Thus, the drain and source voltage 808A of the switch transistors is at a zero voltage value, and the gate voltage 806A, the body voltage 804A, and the gate-source voltage 802A of the switch transistors is at a linear negative voltage value.

Figure 8E:
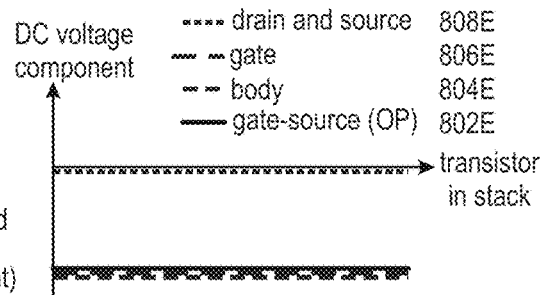
FIG. 8E is a graph of DC voltage components of the stacked RF switch of FIG. 7 for a nominal DC operating point.
Figure 8B:
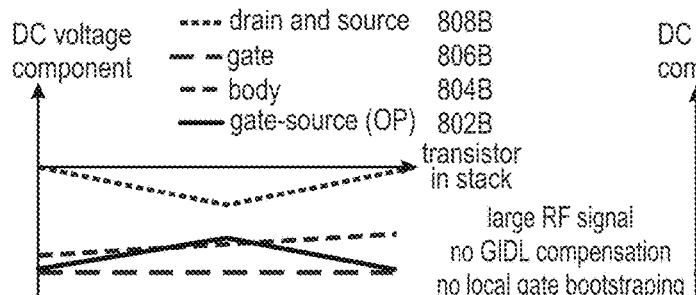
FIG. 8B is a graph of DC voltage components of the stacked RF switch of FIG. 6 with a large RF signal applied with no leakage current compensation and no gate bootstrapping.

FIG. 8B is a graph of DC voltage components of the stacked RF switch 600 of FIG. 6 with a large RF signal applied thereto with no leakage current compensation and no gate bootstrapping. The drain and source voltage 808B of the switch transistors deviates from a zero voltage value due to the action of leakage currents, the gate voltage 806B of the switch transistors is at a linear negative voltage value, the body voltage 804B of the switch transistors increases from an initial negative value due to the action of the leakage currents, and the gate-source voltage 802B of the switch transistors becomes more positive and mirrors the drain and source voltage component due to the action of the leakage currents.

Figure 8F:
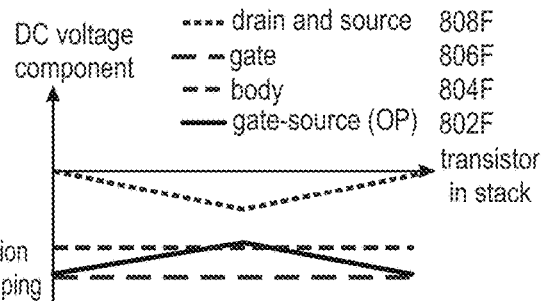
FIG. 8F is a graph of DC voltage components of the stacked RF switch of FIG. 7 with a large RF signal applied with no leakage current compensation and no gate bootstrapping.
Figure 8C:
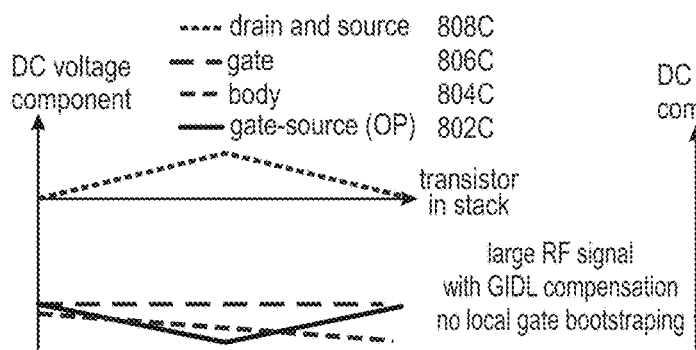
FIG. 8C is a graph of DC voltage components of the stacked RF switch of FIG. 6 with a large RF signal applied having leakage current compensation but no gate bootstrapping.

FIG. 8C is a graph of DC voltage components of the stacked RF switch 600 of FIG. 6 with a large RF signal applied having leakage current compensation but no gate bootstrapping. The drain and source voltage 808C of the switch transistors also deviates from a zero voltage value due to the action of compensation circuits, the gate voltage 806C of the switch transistors is at a linear negative voltage value, the body voltage 804C of the switch transistors decreases from an initial negative value due to the action of the compensation circuits, and the gate-source voltage 802C of the switch transistors becomes more negative and mirrors the drain and source voltage component due to the action of the compensation circuits.

Figure 8G:
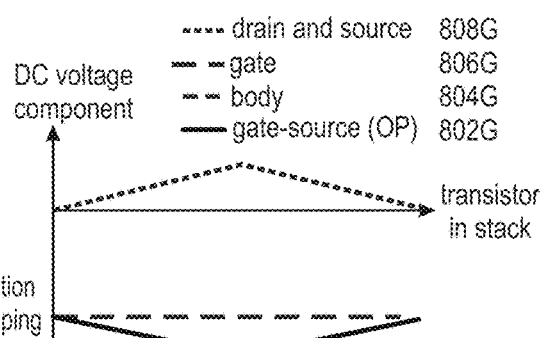
FIG. 8G is a graph of DC voltage components of the stacked RF switch of FIG. 7 with a large RF signal applied having leakage current compensation but no gate bootstrapping.
Figure 8D:
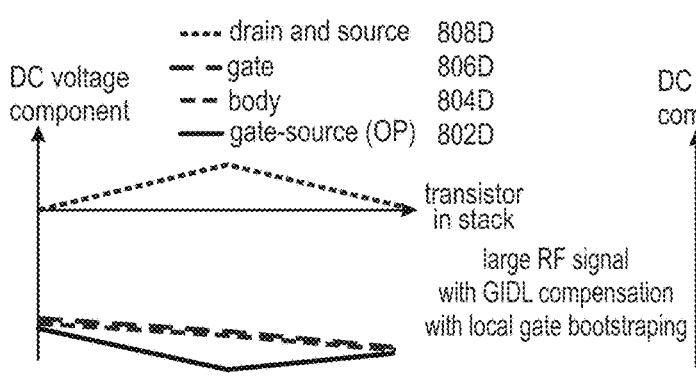
FIG. 8D is a graph of DC voltage components of the stacked RF switch of FIG. 6 with a large RF signal applied having both leakage current compensation and gate bootstrapping, according to an embodiment.

FIG. 8D is a graph of DC voltage components of the stacked RF switch 600 of FIG. 6 with a large RF signal applied having both leakage current compensation and gate bootstrapping, according to an embodiment. The drain and source voltage 808D of the switch transistors also deviates from a zero voltage value due to the action of compensation circuits, the gate voltage 806D of the switch transistors and the body voltage 804D of the switch transistors both decrease from an initial negative value due to the action of the compensation circuits and gate bootstrapping, and the gate-source voltage 802D of the switch transistors becomes more negative and mirrors the drain and source voltage component and advantageously becomes more negative than any other voltage component due to the action of the compensation circuits and gate bootstrapping.

FIG. 8E is a graph of DC voltage components of the stacked RF switch 700 of FIG. 7 for a nominal DC operating point, wherein no RF signal is applied to RF switch 700. Thus, the drain and source voltage 808E of the switch transistors is at a zero voltage value, and the gate voltage 806E, the body voltage 804E, and the gate-source voltage 802A of the switch transistors is at a linear negative voltage value.

FIG. 8F is a graph of DC voltage components of the stacked RF switch 700 of FIG. 7 with a large RF signal applied thereto with no leakage current compensation and no gate bootstrapping. The drain and source voltage 808F of the switch transistors deviates from a zero voltage value due to the action of leakage currents, the gate voltage 806F of the switch transistors is at a first linear negative voltage value, the body voltage 804F of the switch transistors is at a second linear negative voltage value, and the gate-source voltage 802F of the switch transistors becomes more positive and mirrors the drain and source voltage component due to the action of the leakage currents.

FIG. 8G is a graph of DC voltage components of the stacked RF switch 700 of FIG. 7 with a large RF signal applied having leakage current compensation but no gate bootstrapping. The drain and source voltage 808G of the switch transistors also deviates from a zero voltage value due to the action of compensation circuits, the gate voltage 806G of the switch transistors is at a first linear negative voltage value, the body voltage 804G of the switch transistors is at a second linear negative voltage, and the gate-source voltage 802G of the switch transistors becomes more negative and mirrors the drain and source voltage component due to the action of the compensation circuits.

Figure 8H:
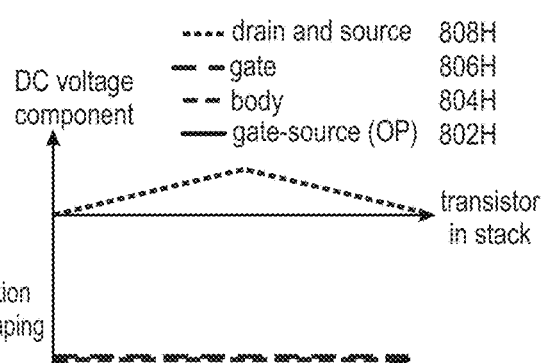
FIG. 8H is a graph of DC voltage components of the stacked RF switch of FIG. 7 with a large RF signal applied having both leakage current compensation and gate bootstrapping, according to an embodiment.

FIG. 8H is a graph of DC voltage components of the stacked RF switch 700 of FIG. 7 with a large RF signal applied having both leakage current compensation and gate bootstrapping, according to an embodiment. The drain and source voltage 808H of the switch transistors also deviates from a zero voltage value due to the action of compensation circuits, the gate voltage 806H of the switch transistors and the body voltage 804H of the switch transistors are both at a linear negative voltage, and the gate-source voltage 802H of the switch transistors becomes more negative and mirrors the drain and source voltage component and advantageously becomes more negative than any other voltage component due to the action of the compensation circuits and gate bootstrapping.

The implementation of the bootstrapping network is described below with respect to FIGS. 9A, 9B, and 9C. According to bootstrapping network embodiments, a low-ohmic path is created between the gate and body of each RF transistor in a stack of an RF switch when the DC gate voltage is less than $V_{ds}$ (indicating that the switch operates on OFF state), and to remove the path, or create a high-ohmic path when the DC gate voltage is higher than $V_{ds}$ (indicating that the switch operates in ON state). Alternatively, a low-ohmic path between the body and drain-source can be established when the switch operates in ON mode.

Figures 9A, 9B, 9C:
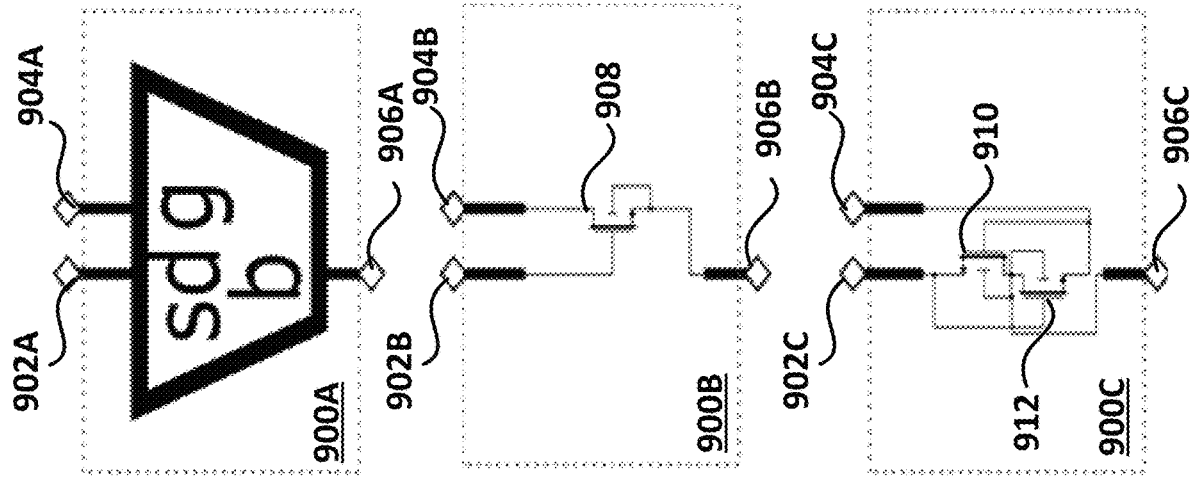
FIG. 9A is an example of a gate bootstrapping network, according to an embodiment.
FIG. 9B is an example of a single transistor gate bootstrapping network, according to an embodiment.
FIG. 9C is an example of a dual transistor gate bootstrapping network, according to an embodiment.

FIG. 9a shows the symbol for a bootstrapping network 900A including a first terminal 902A (the "sd" terminal), a second terminal 904A (the "g" terminal), and a third terminal 906A (the "b" terminal), according to an embodiment. The function and terminal names of the bootstrapping network have been previously described.

FIG. 9B shows a single-transistor bootstrapping network 900B for implementing the symbol of FIG. 9A, according to an embodiment. Bootstrapping network 900B comprises a transistor 908 having a gate terminal coupled to the first terminal 902B, a drain terminal coupled to the second terminal 904B, and a source terminal coupled to the third terminal 906B. According to an embodiment, the body terminal of transistor 908 is coupled to the third terminal 906B.

FIG. 9C shows a two-transistor bootstrapping network 900C for implementing the symbol of FIG. 9A, according to an embodiment. Bootstrapping network 900C comprises a first transistor 912 having a gate terminal coupled to the first terminal 902C, a source terminal coupled to the second terminal 904C; and a second transistor 910 having a gate terminal coupled to the second terminal 904C, a source terminal coupled to the first terminal 902C, wherein a drain of the first transistor 912 is coupled to a drain of the second transistor 910. In an embodiment, the coupled drains are coupled to the third terminal 906C. In an embodiment, the body terminal of first transistor 912 and the body terminal of second transistor 910 are also coupled to the third terminal 906C.

Other embodiment circuits for bootstrapping network 900A can be used for improving the high-voltage handling capability of an RF switch, including one or more transistors.

Figure 10:
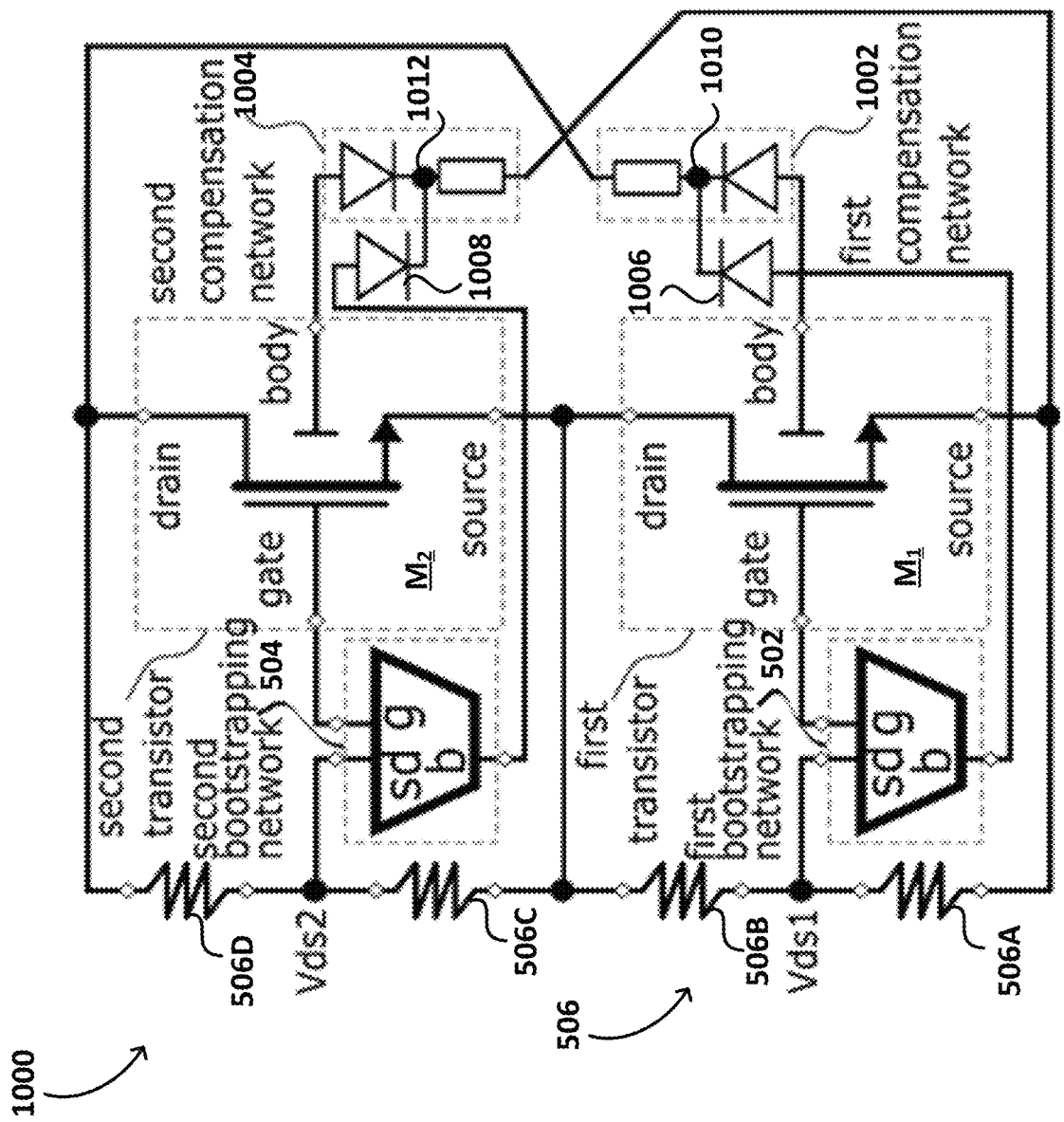
FIG. 10 is a schematic diagram of an RF switch including leakage compensation and gate bootstrapping according to another embodiment.

Another embodiment of an RF switch 1000 with GIDL compensation and gate bootstrapping is shown in FIG. 10. RF switch 1000 includes the bias network 516, first bootstrapping network 512, second bootstrapping network 514, MOS transistor $M_1$, and MOS transistor $M_2$, all as previously described with respect to RF switch 500 of FIG. 5. However, RF switch includes a first compensation network 1002, a second compensation network 1004, a first diode 1006, and a second diode 1008. The first compensation network 1002 is implemented as a series connection of a diode and a resistor, wherein the "b" terminal of first bootstrapping network 512 is tapped to the internal node 1010 of first compensation network 1002 via a diode 1006. The voltage at the anode of diode 1006 is substantially the same as the body voltage of transistor $M_1$, if the same diode type is used as in first compensation network 1002. The second compensation network 1004 is also implemented as a series connection of a diode and a resistor, wherein the "b" terminal of second bootstrapping network 514 is tapped to the internal node 1012 of second compensation network 1004 via a diode 1008. The voltage at the anode of diode 1008 is substantially the same as the body voltage of transistor $M_2$ if the same diode type is used as in second compensation network 1004.

FIG. 11 is a block diagram of a bootstrapping method 1100 for compensating a radio frequency (RF) switch device comprising a first transistor and a second transistor forming a switchable current path, the method comprising causing a first current to flow between a body terminal of the first transistor and a drain terminal of the second transistor in a first direction and causing a second current to flow therebetween in a second direction opposite to the first direction, wherein the first current is larger than the second current in step 1102; establishing a low impedance path between a gate terminal and the body terminal of the first transistor during an OFF mode of operation of the RF switch device in step 1104; and establishing a high impedance path between the gate terminal and the body terminal of the first transistor during an ON mode of operation of the RF switch device in step 1106.

Bootstrapping method 1100 can further comprise causing a third current to flow between a body terminal of the second transistor and a source terminal of the first transistor in step 1108; establishing a low impedance path between a gate terminal and the body terminal of the second transistor during the OFF mode of operation of the RF switch device in step 1110; and establishing a high impedance path between the gate terminal and the body terminal of the second transistor during the ON mode of operation of the RF switch device in step 1112.

Referring now to FIGS. 12A, 12B, 12C, and 12D, a parallel-connected RF switch having one or more compensation circuits and one or more bootstrapping circuits is described according to embodiments.

Figure 12A:
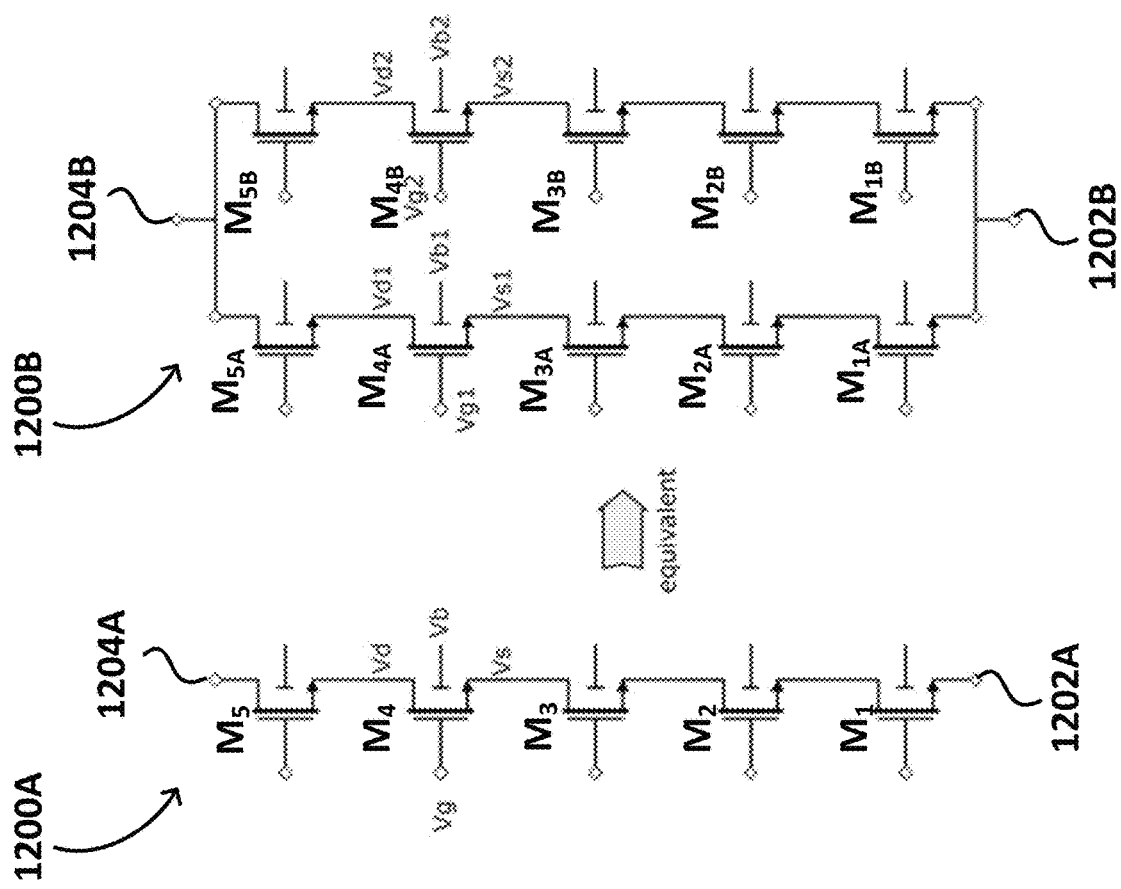
FIG. 12A is a schematic diagram of an RF switch having a single switchable path, and an equivalent RF switch having two parallel switchable paths.

In an embodiment, an RF switch can be constructed using a parallel connection of proportionally-scaled devices that is equivalent to the single device. For example, a single MOS transistor comprising two smaller MOS transistors with all respective terminals coupled together can be considered as an equivalent implementation of the single MOS transistor. Alternatively, individual transistors that are not directly coupled together and reside in parallel switchable paths can also be used, as is shown in FIG. 12A and described in further detail below. According to embodiments the parallel connection of the two switchable paths can be used, wherein the one or more compensations networks and the one or more bootstrapping networks may be coupled to either one of the respective terminals of the individual transistors in each stack of transistors.

For example, referring to FIG. 12A, if a bootstrapping circuit (not shown in FIG. 12A) is coupled to gate, body, and source terminals $\{V_g, V_b, V_s\}$ of transistors in RF switch 1200A, it will operate equivalently if the same bootstrapping circuit is coupled to gate, body, and source terminals $\{V_{g1}, V_{b2}, V_{s1}\}$ in RF switch 1200B, gate, body, and source terminals $\{V_{g2}, V_{b2}, V_{s1}\}$ in RF switch 1200B or gate, body, and source terminals $\{V_{g2}, V_{b1}, V_{s2}\}$ in RF switch 1200B or any other similar combination of terminals. The reason for equivalent operation between RF switch 1200A and RF switch 1200B is that DC and AC components of voltages along the two switchable current paths of RF switch 1200B at the respective transistor in each stack are the same.

FIG. 12A is a schematic diagram of an RF switch 1200A having a single switchable path, and an equivalent RF switch 1200B having two parallel switchable paths. The single switchable path in RF switch 1200A comprises MOS transistors $M_1$, $M_2$, $M_3$, $M_4$, and $M_5$ is a stacked configuration between switch nodes 1202A and 1204A. The drain terminal $V_d$, source terminal $V_s$ gate terminal $V_g$, and body terminal $V_s$ are identified for transistor $M_4$, but not specifically shown in the other MOS transistors in the stack for simplicity. A first switchable path in RF switch 1200B comprises MOS transistors $M_{1A}$, $M_{2A}$, $M_{3A}$, $M_{4A}$, and $M_{5A}$ is a stacked configuration between switch nodes 1202B and 1204B. The drain terminal $V_{d1}$, source terminal $V_{s1}$, gate terminal $V_{g1}$, and body terminal $V_{s1}$ are identified for transistor $M_{4A}$, but not specifically shown in the other MOS transistors in the stack for simplicity. A second switchable path in RF switch 1200B comprises MOS transistors $M_{1B}$, $M_{2B}$, $M_{3B}$, $M_{4B}$, and $M_{5B}$ is a stacked configuration between switch nodes 1202B and 1204B. The drain terminal $V_{d2}$, source terminal $V_{s2}$, gate terminal $V_{g2}$, and body terminal $V_{s2}$ are identified for transistor $M_{4B}$, but not specifically shown in the other MOS transistors in the stack for simplicity. In RF switch 1200B, transistors in the first and second switchable path having the same rank order may be considered separate transistors or first and second transistor portions of the same transistor. For example, although transistors $M_{4A}$ and $M_{4B}$ are shown to have separate transistor terminals and shown as separate transistors, transistors $M_{4A}$ and $M_{4B}$ may be considered as transistor portions of the same equivalent transistor since the terminal voltages of each transistor portion is the same.

Figure 12D:
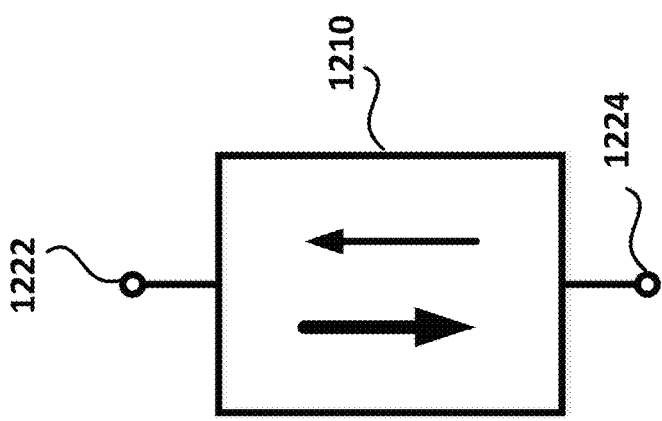
FIG. 12D is a schematic diagram of an example second compensation network that can be used with either of the RF switches shown in FIG. 12A.
Figure 12B:
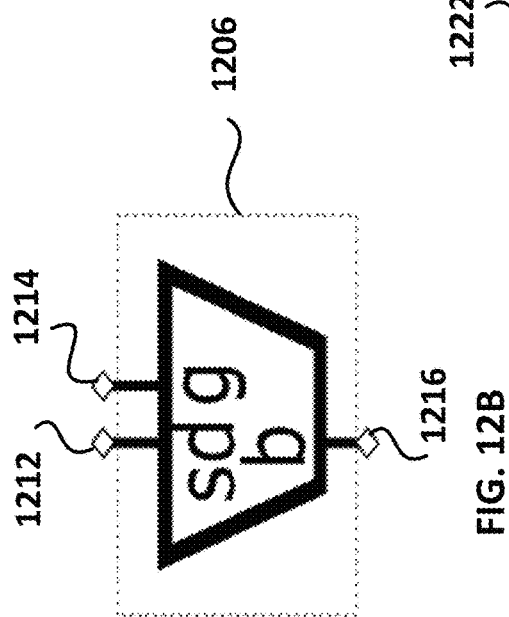
FIG. 12B is a schematic diagram of an example gate bootstrapping network that can be used with either of the RF switches shown in FIG. 12A.

FIG. 12B is a schematic diagram of an example bootstrapping network 1206 that can be used with either of the RF switches 1200A or 1200B shown in FIG. 12A, including a first terminal 121, a second terminal 1214, and a third terminal 1216. The connection of bootstrapping network 1206 with a single RF switch such as RF switch 1200A has been previously described. The connection of bootstrapping network 1206 with a parallel RF switch such as RF switch 1200B is described below. First terminal 1212 is coupled to a bias network as has been previously described. The second terminal 1214 is coupled to the gate terminal of a first transistor portion or the gate terminal of a second transistor portion. The third terminal 1216 is coupled to the body terminal of a first transistor portion or the body terminal of a second transistor portion.

Figure 12C:
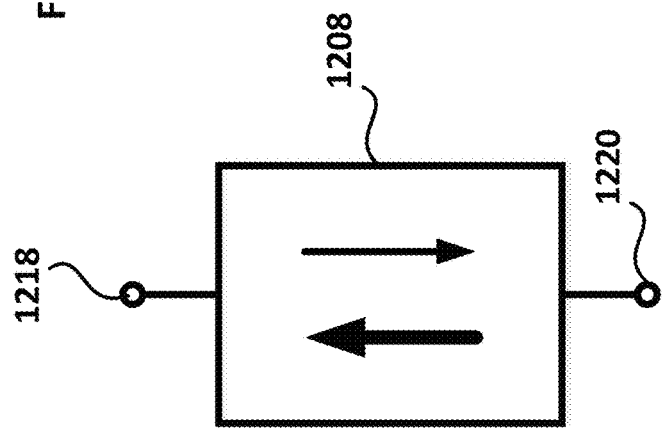
FIG. 12C is a schematic diagram of an example first compensation network that can be used with either of the RF switches shown in FIG. 12A.

FIG. 12C is a schematic diagram of an example first compensation network 1208 that can be used with either of the RF switches 1200A or 1200B shown in FIG. 12A, including a first terminal 1220 and a second terminal 1218. The connection of first compensation network 1208 with a single RF switch such as RF switch 1200A has been previously described. The connection of first compensation network 1208 is described below. The first terminal 1220 is coupled to the body terminal of a first transistor portion or the body terminal of a second transistor portion. The second terminal 1218 is coupled to the drain terminal of a first adjacent transistor portion or the drain terminal of a second adjacent transistor portion.

FIG. 12D is a schematic diagram of an example second compensation network 1210 that can be used with either of the RF switches 1200A or 1200B shown in FIG. 12A, including a first terminal 1222 and a second terminal 1224. The connection of second compensation network 1210 with a single RF switch such as RF switch 1200A has been previously described. The connection of second compensation network 1210 is described below. The first terminal 1222 is coupled to the body terminal of a first transistor portion or the body terminal of a second transistor portion. The second terminal 1224 is coupled to the source terminal of a first adjacent transistor portion or the source terminal of a second adjacent transistor portion.

Example embodiments of the present invention are summarized here. Other embodiments can also be understood from the entirety of the specification and the claims filed herein.

Example 1. A radio frequency (RF) switch device includes a first transistor and a second transistor, wherein the first and second transistors are coupled in series at a first source/drain terminal of the second transistor to establish a switchable RF path; a first compensation network coupled between a body terminal of the first transistor and a second source/drain terminal of the second transistor, wherein the first compensation network is configured to establish a path for current flowing between the body terminal of the first transistor and the second source/drain terminal of the second transistor in a first direction and to block current flowing therebetween in a second direction opposite to the first direction; and a first bootstrapping network having a first terminal coupled to a first bias terminal, a second terminal coupled to a gate terminal of the first transistor, and a third terminal coupled to the body terminal of the first transistor, wherein the first bootstrapping network is configured to establish a low impedance path between the gate terminal and the body terminal of the first transistor in response to a first voltage value of the first bias terminal, and wherein the first bootstrapping network is configured to establish a high impedance path between the gate terminal and the body terminal of the first transistor in response to a second voltage value of the first bias terminal.

Example 2. The RF switch device of Example 1, wherein the first bootstrapping network includes a third transistor having a gate terminal coupled to the first terminal, a drain terminal coupled to the second terminal, and a source terminal coupled to the third terminal.

Example 3. The RF switch device of any of the above examples, wherein the first bootstrapping network includes a third transistor having a gate terminal coupled to the first terminal, a source terminal coupled to the second terminal; and a fourth transistor having a gate terminal coupled to the second terminal, a source terminal coupled to the first terminal, wherein a drain of the third transistor is coupled to a drain of the fourth transistor.

Example 4. The RF switch device of any of the above examples, further including a resistor divider coupled across a current path of the first transistor and coupled to the first bias terminal.

Example 5. The RF switch device of any of the above examples, wherein the current flowing in the first direction is configured to be less than or equal to a leakage current associated with the body terminal of the first transistor.

Example 6. The RF switch device of any of the above examples, further including a second compensation network coupled between a body terminal of the second transistor and a source/drain terminal of the first transistor; and a second bootstrapping network having a first terminal coupled to a second bias terminal, a second terminal coupled to a gate terminal of the second transistor, and a third terminal coupled to the body terminal of the second transistor.

Example 7. The RF switch device of any of the above examples, wherein the switchable RF path includes a first switchable RF path and a second switchable RF path in parallel with the first switchable RF path.

Example 8. The RF switch device of any of the above examples, wherein the first transistor includes a first transistor portion in the first switchable RF path, and a second transistor portion in the second switchable RF path.

Example 9. The RF switch device of any of the above examples, wherein the gate terminal of the first transistor includes a gate terminal of the first transistor portion or a gate terminal of the second transistor portion, and wherein the body terminal of the first transistor includes a body terminal of the first transistor portion or a body terminal of the second transistor portion.

Example 10. The RF switch device of any of the above examples, wherein the second transistor includes a first transistor portion in the first switchable RF path, and a second transistor portion in the second switchable RF path.

Example 11. A radio frequency (RF) switch device including a first transistor and a second transistor, wherein the first and second transistors are coupled in series at a first source/drain terminal of the second transistor to establish a switchable RF path; a first compensation network coupled between a body terminal of the first transistor and a second source/drain terminal of the second transistor, wherein the first compensation network is configured to establish a path for current flowing between the body terminal of the first transistor and the second source/drain terminal of the second transistor in a first direction and to block current flowing therebetween in a second direction opposite to the first direction; and a first bootstrapping network having a first terminal coupled to a first bias terminal, a second terminal coupled to a gate terminal of the first transistor, and a third terminal coupled to an internal node of the first compensation network, wherein the first bootstrapping network is configured to establish a low impedance path between the gate terminal and the body terminal of the first transistor in response to a first voltage value of the first bias terminal, and wherein the first bootstrapping network is configured to establish a high impedance path between the gate terminal and the body terminal of the first transistor in response to a second voltage value of the first bias terminal.

Example 12. The RF switch device of Example 11, wherein the third terminal is coupled to the internal node of the first compensation network through a diode.

Example 13. The RF switch device of any of the above examples, wherein the first bootstrapping network includes a third transistor having a gate terminal coupled to the first terminal, a drain terminal coupled to the second terminal, and a source terminal coupled to the third terminal.

Example 14. The RF switch device of any of the above examples, wherein the first bootstrapping network includes a third transistor having a gate terminal coupled to the first terminal, a source terminal coupled to the second terminal; and a fourth transistor having a gate terminal coupled to the second terminal, a source terminal coupled to the first terminal, wherein a drain of the third transistor is coupled to a drain of the fourth transistor.

Example 15. The RF switch device of any of the above examples, further including a resistor divider coupled across a current path of the first transistor and coupled to the first bias terminal.

Example 16. The RF switch device of any of the above examples, wherein the current flowing in the first direction is configured to be less than or equal to a leakage current associated with the body terminal of the first transistor.

Example 17. The RF switch device of any of the above examples, further including a second compensation network coupled between a body terminal of the second transistor and a source/drain terminal of the first transistor; and a second bootstrapping network having a first terminal coupled to a second bias terminal, a second terminal coupled to a gate terminal of the second transistor, and a third terminal coupled to an internal node of the second compensation network.

Example 18. The RF switch device of any of the above examples, wherein the third terminal of the second bootstrapping network is coupled to the internal node of the second compensation network through a diode.

Example 19. According to an embodiment, a method of compensating a radio frequency (RF) switch device including a first transistor and a second transistor forming a switchable current path, wherein the method includes causing a first current to flow between a body terminal of the first transistor and a drain terminal of the second transistor in a first direction and causing a second current to flow therebetween in a second direction opposite to the first direction, wherein the first current is larger than the second current; establishing a low impedance path between a gate terminal and the body terminal of the first transistor during an OFF mode of operation of the RF switch device; and establishing a high impedance path between the gate terminal and the body terminal of the first transistor during an ON mode of operation of the RF switch device.

Example 20. The method of Example 19, further including causing a third current to flow between a body terminal of the second transistor and a source terminal of the first transistor; establishing a low impedance path between a gate terminal and the body terminal of the second transistor during the OFF mode of operation of the RF switch device; and establishing a high impedance path between the gate terminal and the body terminal of the second transistor during the ON mode of operation of the RF switch device.

Example 21. According to an embodiment, a radio frequency (RF) switch device includes a first transistor and a second transistor, wherein the first and second transistors are coupled in series to establish a first switchable RF path; a third transistor and fourth transistor, wherein the third and fourth transistors are coupled in series to establish a second switchable RF path in parallel with the first switchable RF path; a first non-linear compensation network coupled between a body terminal of the first transistor and a drain terminal of the second transistor; and a first bootstrapping network having a first terminal coupled to a gate terminal of the first transistor or a gate terminal of the third transistor, a second terminal coupled to the body terminal of the first transistor or a body terminal of the third transistor, and a third terminal coupled to a first bias terminal.

Example 22. The RF switch device of Example 21, wherein the first bootstrapping network is configured to establish a low impedance path in response to a first voltage value of the first bias terminal, and wherein the first bootstrapping network is configured to establish a high impedance path in response to a second voltage value of the first bias terminal.

Example 23. The RF switch device of any of the above examples, further including a second compensation network coupled between a body terminal of the second transistor and a source terminal of the first transistor.

Example 24. The RF switch device of any of the above examples, further including a second bootstrapping network having a first terminal coupled to a gate terminal of the second transistor or a gate terminal of the fourth transistor, a second terminal coupled to the body terminal of the second transistor or a body terminal of the fourth transistor, and a third terminal coupled to a second bias terminal.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio frequency (RF) switch device comprising:
   a first transistor and a second transistor, wherein the first and second transistors are coupled in series at a drain terminal of the first transistor and a source terminal of the second transistor to establish a switchable RF path;

a first resistor divider including a first resistor and a second resistor and having a first terminal, a second terminal, and a tap defined at an interconnection of the first resistor and second resistor, the first terminal directly coupled to the drain terminal of the first transistor and the second terminal directly coupled to a source terminal of the first transistor;

a first compensation network coupled between a body terminal of the first transistor and a drain terminal of the second transistor, wherein the first compensation network is configured to establish a path for current flowing between the body terminal of the first transistor and the drain terminal of the second transistor in a first direction and to block current flowing therebetween in a second direction opposite to the first direction; and a first bootstrapping network having a first terminal directly coupled to a tap of the first resistor divider, a second terminal coupled to a gate terminal of the first transistor, and a third terminal coupled to the body terminal of the first transistor, wherein the first bootstrapping network is configured to establish a low impedance path between the gate terminal and the body terminal of the first transistor in response to a first voltage value of the drain terminal of the first transistor, and wherein the first bootstrapping network is configured to establish a high impedance path between the gate terminal and the body terminal of the first transistor in response to a second voltage value of the drain terminal of the first transistor.

2. The RF switch device of claim 1, wherein the first bootstrapping network comprises a third transistor having a gate terminal coupled to the first terminal, a drain terminal coupled to the second terminal, and a source terminal coupled to the third terminal.

3. The RF switch device of claim 1, wherein the first bootstrapping network comprises:
a third transistor having a gate terminal coupled to the first terminal, a source terminal coupled to the second terminal; and
a fourth transistor having a gate terminal coupled to the second terminal, a source terminal coupled to the first terminal,
wherein a drain of the third transistor is coupled to a drain of the fourth transistor.

4. The RF switch device of claim 1, further comprising a second resistor divider coupled across a current path of the second transistor.

5. The RF switch device of claim 1, wherein the current flowing in the first direction is configured to be less than or equal to a leakage current flowing through the body terminal of the first transistor.

6. The RF switch device of claim 1, further comprising:
a second compensation network coupled between a body terminal of the second transistor and the source terminal of the first transistor; and
a second bootstrapping network having a first terminal coupled to a second bias terminal, a second terminal coupled to a gate terminal of the second transistor, and a third terminal coupled to the body terminal of the second transistor.

7. The RF switch device of claim 1, wherein the switchable RF path comprises a first switchable RF path and a second switchable RF path in parallel with the first switchable RF path.

8. The RF switch device of claim 7, wherein the first transistor comprises a first transistor portion in the first switchable RF path, and a second transistor portion in the second switchable RF path.

9. The RF switch device of claim 8, wherein the gate terminal of the first transistor comprises a gate terminal of the first transistor portion or a gate terminal of the second transistor portion, and wherein the body terminal of the first transistor comprises a body terminal of the first transistor portion or a body terminal of the second transistor portion.

10. The RF switch device of claim 7, wherein the second transistor comprises a first transistor portion in the first switchable RF path, and a second transistor portion in the second switchable RF path.

11. A method of compensating a radio frequency (RF) switch device comprising a first transistor and a second transistor forming a switchable current path, the method comprising:
causing a first current to flow between a body terminal of the first transistor and a drain terminal of the second transistor in a first direction and causing a second current to flow therebetween in a second direction opposite to the first direction, wherein the first current is larger than the second current;
using a first bootstrapping network having a first terminal directly coupled to a tap of a resistor divider including a first resistor and a second resistor and having a first divider terminal, a second divider terminal, and a tap defined at an interconnection of the first resistor and second resistor, the first divider terminal directly coupled to a drain terminal of the first transistor and the second divider terminal directly coupled to a source terminal of the first transistor, a second terminal of the first bootstrapping network coupled to a gate terminal of the first transistor, and a third terminal coupled to the body terminal of the first transistor,
establishing a low impedance path between a gate terminal and the body terminal of the first transistor during an OFF mode of operation of the RF switch device; and
establishing a high impedance path between the gate terminal and the body terminal of the first transistor during an ON mode of operation of the RF switch device.

12. The method of claim 11, further comprising:
causing a third current to flow between a body terminal of the second transistor and a source terminal of the first transistor;
establishing a low impedance path between a gate terminal and the body terminal of the second transistor during the OFF mode of operation of the RF switch device; and
establishing a high impedance path between the gate terminal and the body terminal of the second transistor during the ON mode of operation of the RF switch device.

* * * * *